(12) United States Patent
Sawatari et al.

(10) Patent No.: US 8,923,009 B2
(45) Date of Patent: Dec. 30, 2014

(54) SUBSTRATE WITH BUILT-IN ELECTRONIC COMPONENT

(71) Applicant: Taiyo Yuden Co., Ltd., Tokyo (JP)

(72) Inventors: Tatsuro Sawatari, Tokyo (JP); Yuichi Sugiyama, Tokyo (JP); Hiroshi Nakamura, Tokyo (JP); Masaki Naganuma, Tokyo (JP); Tetsuo Saji, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 9 days.

(21) Appl. No.: 13/909,880

(22) Filed: Jun. 4, 2013

(65) Prior Publication Data

US 2014/0133120 A1 May 15, 2014

(30) Foreign Application Priority Data

Nov. 9, 2012 (JP) ................. 2012-247417

(51) Int. Cl.
| | |
|---|---|
| *H05K 1/18* | (2006.01) |
| *H05K 1/00* | (2006.01) |
| *H05K 7/00* | (2006.01) |
| *H05K 1/16* | (2006.01) |
| *H05K 1/02* | (2006.01) |

(52) U.S. Cl.
CPC .............. *H05K 1/185* (2013.01); *H05K 1/0213* (2013.01)
USPC ........... 361/761; 361/748; 361/760; 361/763; 361/766

(58) Field of Classification Search
CPC ........... H01L 2924/01078; H01L 2924/01079; H01L 2924/14; H01L 2224/48; H01L 2924/01029; H01L 2224/16; H01L 23/5389; H01L 2924/19041; H05K 1/182; H05K 1/0231; H05K 1/162; H05K 1/167; H05K 2201/09672; H05K 1/112; H05K 2201/09309
USPC .......... 361/772, 761, 763, 766; 174/255, 258, 174/259, 260, 261
See application file for complete search history.

(56) References Cited

U.S. PATENT DOCUMENTS

| | | | |
|---|---|---|---|
| 8,536,959 B1 * | 9/2013 | Mugiya et al. ................. | 333/186 |
| 2007/0096292 A1 * | 5/2007 | Machida ........................ | 257/700 |
| 2009/0084596 A1 * | 4/2009 | Inoue et al. .................... | 174/261 |
| 2009/0244865 A1 * | 10/2009 | Tanaka .......................... | 361/764 |
| 2011/0203836 A1 * | 8/2011 | Yokota et al. ................. | 174/250 |
| 2012/0319254 A1 * | 12/2012 | Kikuchi et al. ............... | 257/659 |
| 2013/0003314 A1 | 1/2013 | Igarashi et al. | |

FOREIGN PATENT DOCUMENTS

| | | |
|---|---|---|
| JP | 2002-151846 A | 5/2002 |
| JP | 2003-249765 A | 9/2003 |
| JP | 2007-142182 A | 6/2007 |
| JP | 2008-060413 A | 3/2008 |

(Continued)

OTHER PUBLICATIONS

Japanese Office Action dated Aug. 7, 2013, in a counterpart Japanese patent application No. 2013-023204.

*Primary Examiner* — Tuan T Dinh
*Assistant Examiner* — Ahmad D Barnes
(74) *Attorney, Agent, or Firm* — Chen Yoshimura LLP

(57) ABSTRACT

In a first conductive layer and a third conductive layer that are respectively closest to a core layer having a storage portion that penetrates therethrough, four first penetrating holes and four first penetrating holes are formed so as to overlap part of an opening edge of the storage portion that is projected onto the first conductive layer and the third conductive layer, respectively.

10 Claims, 5 Drawing Sheets

(56) References Cited

FOREIGN PATENT DOCUMENTS

| | | |
|---|---|---|
| JP | 2010-118581 A | 5/2010 |
| JP | 2011-108901 A | 6/2011 |
| JP | 2011-187831 A | 9/2011 |
| WO | 2011/102561 A1 | 8/2011 |

* cited by examiner

SUBSTRATE WITH BUILT-IN ELECTRONIC COMPONENT

This application claims the benefit of Japanese Application No. 2012-247417, filed in Japan on Nov. 9, 2012, which is hereby incorporated by reference in its entirety.

BACKGROUND OF THE INVENTION

1. Field of the Invention

The present invention relates to a substrate with built-in electronic component in which an electronic component is embedded in a substrate, and more particularly, to a substrate with built-in electronic component in which an electronic component is stored in a storage portion formed in a core layer.

2. Description of Related Art

Known examples of substrates with built-in electronic component include a "substrate not provided with a core layer" disclosed in Patent Document 1 below, for example, and a "substrate provided with a core layer" disclosed in Patent Document 2 below, for example. The "substrate not provided with a core layer" has a structure in which an electronic component is embedded in an insulating layer, and the electronic component is held in a proper place by being covered with a synthetic resin constituting the insulating layer. The "substrate provided with a core layer" has a structure in which an electronic component is stored in a storage portion that is formed so as to penetrate the core layer. When there is space between the electronic component and inner walls of the storage portion, the space is filled with a synthetic region, and the electronic component is held in a proper position by being covered by the synthetic resin filler.

In the "substrate provided with a core layer," if the synthetic resin filler has higher moisture absorbency than moisture absorbency of the core layer, the following problems occur. That is, because various electronic components are generally mounted on a substrate with built-in electronic component by the reflow soldering method, due to the heat generated in the reflow soldering, moisture included in the synthetic resin filler is evaporated, and tries to escape to the outside. When insulating layers made of a synthetic resin and conductive layers made of a metal are alternately formed on one surface and the other surface of the core layer in the thickness direction, the vapor tries to escape to the outside from the end of each insulating layer closest to the core layer, travelling through the insulating layer. However, because the path through which the vapor travels to be released to the outside is long, possible problems can be caused by the vapor, such as a crack in the respective insulating layers closest to the core layer, layer separation between the insulating layer and the core layer, and layer separation between the insulating layer and a conductive layer closest to the core layer.

RELATED ART DOCUMENTS

Patent Documents

Patent Document 1: Japanese Patent Application Laid-Open Publication No. 2008
Patent Document 2: Japanese Patent Application Laid-Open Publication No. 2010-118581

SUMMARY OF THE INVENTION

An object of the present invention is to provide a substrate with built-in electronic component that can prevent a problem of a crack in an insulating layer and the like.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a substrate with built-in electronic component including: a core layer having a storage portion penetrating the core layer; an electronic component stored in the storage portion; a synthetic resin filler filling a space between the electronic component and inner walls of the storage portion, the synthetic resin filler having a higher moisture absorbency than that of the core layer; and two or more pairs of an insulating layer and a conductive layer disposed on two opposite surfaces of the core layer in a thickness direction, respectively, the insulating layers being made of a synthetic resin, the conductive layers being made of a metal, wherein, of the two or more pairs of the insulating layer and the conductive layers disposed on at least one of two opposite surfaces of the core layer in a thickness direction, a conductive layer closest to the core layer has at least one first penetrating hole formed therein so as to overlap at least part of an opening edge of the storage portion in a plan view.

According to the present invention, it is possible to provide a substrate with built-in electronic component that can prevent a problem of a crack in an insulating layer and the like.

The above-mentioned objects, other objects, and features and effects for the respective objects of the present invention will be made apparent from the descriptions that follow and appended drawings.

DETAILED DESCRIPTION OF THE PREFERRED EMBODIMENTS

Embodiment 1

Figure 1:
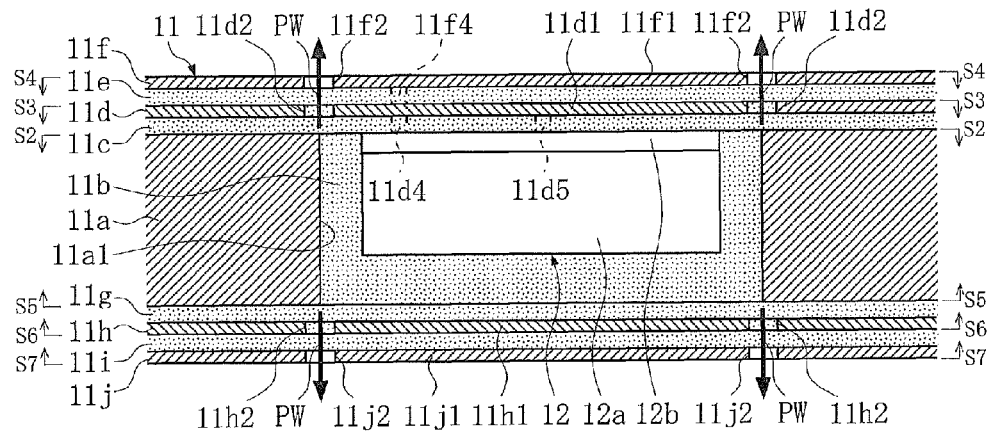
FIG. 1 is a vertical cross-sectional view showing a main part of a substrate with built-in electronic component according to Embodiment 1 of the present invention.

A substrate with built-in electronic component shown in FIGS. 1 to 7 has a structure in which an electronic component, which is a SAW filter 12 utilizing surface acoustic waves, is embedded in a multilayer substrate 11. The line S1-S1 in FIGS. 2 to 7 indicates a cross-section position of FIG. 1.

The substrate 11 includes: a core layer 11a having a storage portion 11a1 of a substantial rectangular cuboid shape formed so as to penetrate the core layer 11a in the thickness direction; a synthetic resin (will be referred to as a synthetic resin filler below) 11b that fills a space between the SAW filter 12 stored in the storage portion 11a1 and inner walls of the storage portion 11a1; a first insulating layer 11c formed on the upper surface (one surface in the thickness direction) of the core layer 11a; a first conductive layer 11d formed on the upper surface of the first insulating layer 11c; a second insulating layer 11e formed on the upper surface of the first conductive layer 11d; a second conductive layer 11f formed on the upper surface of the second insulating layer 11e; a third insulating layer 11g formed on the lower surface (the other surface in the thickness direction) of the core layer 11a; a third conductive layer 11h formed on the lower surface of the third insulating layer 11g; a fourth insulating layer 11i formed on the lower surface of the third conductive layer 11h; and a fourth conductive layer 11j formed on the lower surface of the fourth insulating layer 11i.

The core layer 11a is made of a metal such as copper or a copper alloy, and is formed in a thickness of 100 to 400 μm, for example. The synthetic resin filler 11b and the respective insulating layers 11c, 11e, 11g, and 11i are made of a synthetic resin such as an epoxy resin, polyimide, a bismaleimide triazine resin, or a material obtained by adding a reinforcing material such as glass fiber to any of these resins, and the thickness of the insulating layers 11c, 11e, 11g, and 11i is set to 10 to 30 μm, for example. Because the core layer 11a is made of a metal, the moisture absorbency of the synthetic resin filler 11b is higher than that of the core layer 11a.

The respective conductive layers 11d, 11f, 11h, and 11j are made of a metal such as copper or a copper alloy, and the thickness thereof is set to 5 to 25 μm, for example. In the respective conductive layers 11d, 11f, 11h, and 11j, signal wiring lines and ground wiring lines (see the reference characters of 11d1, 11f1, 11h1, and 11j1) are patterned in a two-dimensional manner, and conductor vias (see the reference characters of 11d4, 11d5, and 11f4) that are continued to, or not continued to the ground wiring lines are formed so as to penetrate the respective insulating layers interposed therebetween. The conductor vias are made of a metal such as copper or a copper alloy, and the maximum diameter thereof is set to 10 to 80 μm, for example.

That is, on the upper surface and the lower surface of the core layer 11a in the substrate 11, two pairs of insulating layers made of a synthetic resin and conductive layers made of a metal are respectively provided.

The SAW filter 12 includes a filter body 12a that is made of a piezoelectric material such as lithium tantalate or lithium niobate and that is formed in a substantial rectangular cuboid shape, a filter function part disposed on the upper surface of the filter body 12a (not shown in the figure), at least one cover that covers the filter function part (not shown in the figure), a sealing portion 12b that covers the cover, and an input terminal 12c, an output terminal 12d, and three ground terminals 12e of a substantial circular shape exposed from the upper surface of the sealing portion 12b. The filter function part has a ladder structure including a plurality of resonators connected in series and a plurality of resonators connected in parallel thereto, for example, and each resonator includes comb-shaped electrodes and reflectors disposed on both sides thereof.

Figure 2:
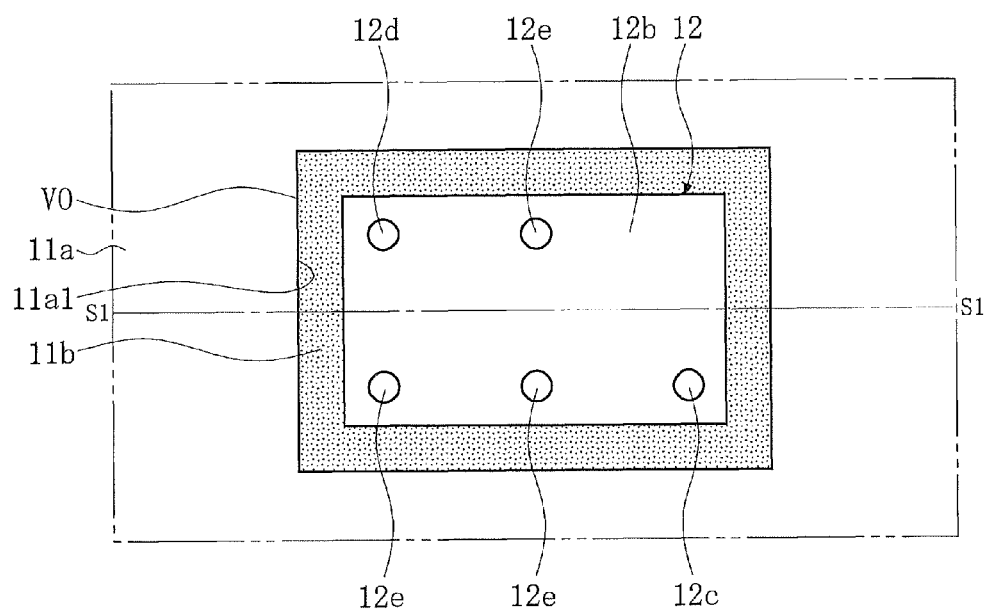
FIG. 2 is a horizontal cross-sectional view along the line S2-S2 of FIG. 1.
Figure 5:
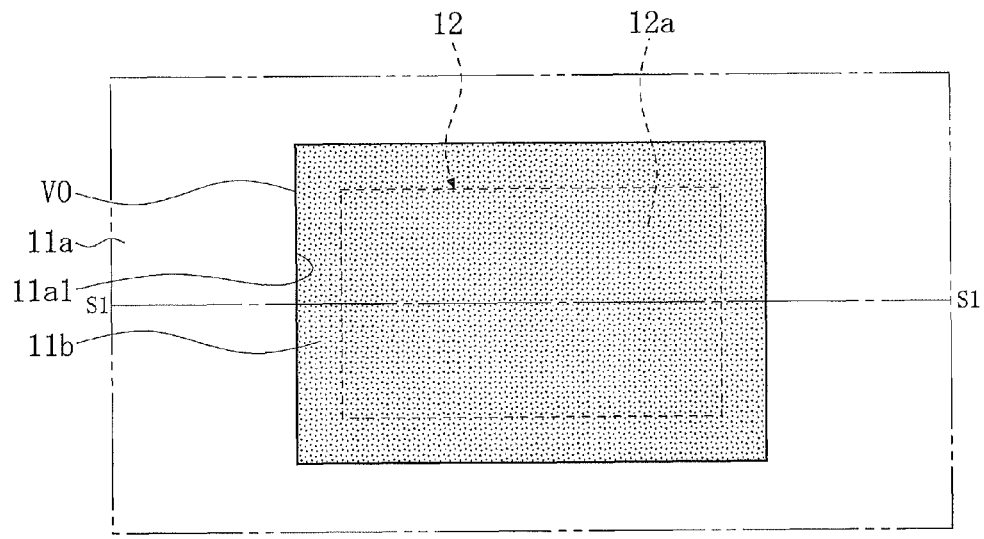
FIG. 5 is a horizontal cross-sectional view along the line S5-S5 of FIG. 1.

As shown in FIGS. 1, 2, and 5, the SAW filter 12 is formed in a substantial rectangular cuboid shape that is smaller than the storage portion 11a1 formed in the core layer 11a. More specifically, the cross-sectional shape and the depth (corresponding to the thickness of the core layer 11a) of the storage portion 11a1 formed in the core layer 11a are greater than the cross-sectional shape and height of the SAW filter 12, and also, the SAW filter 12 is placed in the upper center of the storage portion 11a1 of the SAW filter 12. Therefore, the space is formed on the four sides and bottom of the SAW filter 12. That is, the four side faces and the lower surface of the SAW filter 12 stored in the storage portion 11a1 are covered by the synthetic resin filler 11b, thereby holding the SAW filter 12 in a proper place. The reference character V0 shown in FIGS. 2 and 5 represents an opening edge of the storage portion 11a1.

Figure 3:
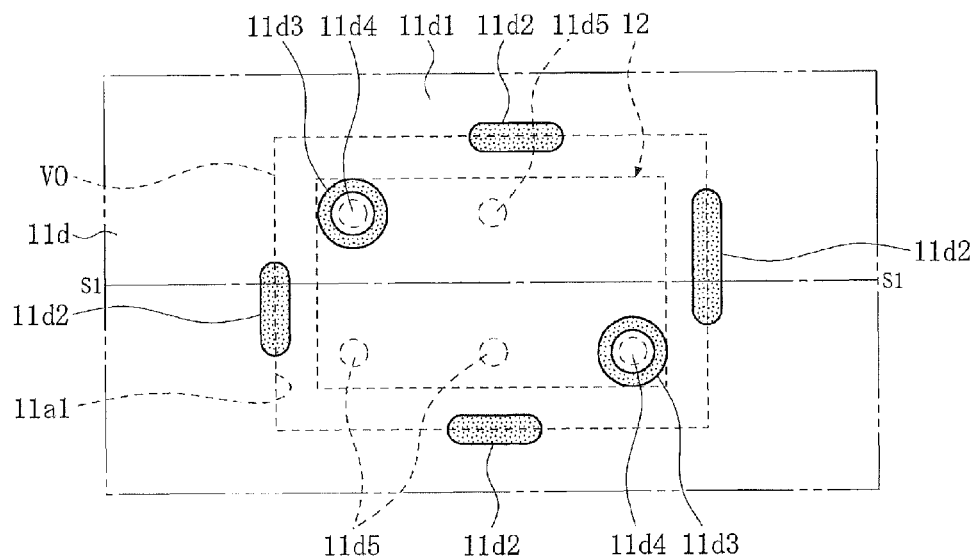
FIG. 3 is a horizontal cross-sectional view along the line S3-S3 of FIG. 1.

As shown in FIG. 3, in the ground wiring portion 11d1 in the first conductive layer 11d that is closest to the upper surface of the core layer 11a, four first penetrating holes 11d2 are formed so as to overlap part of the opening edge V0 of the storage portion 11a1 projected onto the ground wiring portion 11d1 of the first conductive layer 11d in a parallel manner. More specifically, three out of the four first penetrating holes 11d2 have substantially the same width and length, and the remaining one has the substantially same width as the other three while having a different length. The four first penetrating holes 11d2 are formed such that the respective centers thereof in the width direction substantially coincide with respective four sides of the opening edge V0 of the storage portion 11a1 projected in a parallel manner. The four first penetrating holes 11d2 are respectively filled with the same synthetic resin as that forming the second insulating layer 11e, for example. The width of each first penetrating hole 11d2 is set to 0.01 to 1.0 mm, for example, and more preferably to 0.05 to 0.2 mm. The length thereof is set to 0.01 to 5.0 mm, for example, and more preferably to 0.1 to 1.0 mm.

In the ground wiring portion 11d1 of the first conductive layer 11d, two penetrating holes 11d3 in a substantially circular shape are formed so as to correspond to the input terminal 12c and the output terminal 12d of the SAW filter 12, and inside of the respective two penetrating holes 11d3, conductor vias 11d4 are formed so as not to make contact with the penetrating holes 11d3. The conductor vias 11d4 have a T-shaped cross section, and are constituted of a disk portion and a columnar portion, respectively. The thickness and the height of the disk portions of the two conductor vias 11d4 are the same as those of the ground wiring portion 11d1, and the bottom end of the columnar portion of one conductor via 11d4 is connected to the input terminal 12c of the SAW filter 12, and the bottom end of the columnar portion of the other conductor via 11d4 is connected to the output terminal 12d of the SAW filter 12. Respective ring-shaped spaces between the two penetrating holes 11d3 and the disk portions of the two conductor vias 11d4, which are disposed therein, are filled with the same synthetic resin as that forming the second insulating layer 11e, for example.

Further, on the lower surface side of the ground wiring portion 11d1 of the first conductive layer 11d, three columnar conductor vias 11d5 are formed continuously from the ground wiring portion 11d1 so as to correspond to the respective three ground terminals 12e of the SAW filter 12. The bottom ends of the three conductor vias 11d5 are connected to the three ground terminals 12e of the SAW filter 12, respectively.

Figure 4:
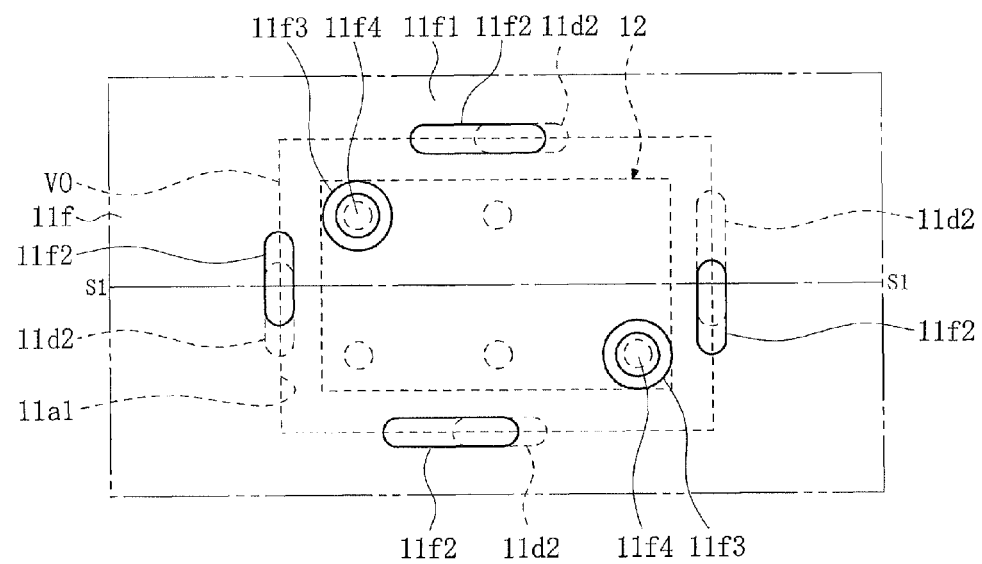
FIG. 4 is a horizontal cross-sectional view along the line S4-S4 of FIG. 1.

As shown in FIG. 4, in the ground wiring portion 11f1 of the second conductive layer 11f that is second closest to the upper surface of the core layer 11a, four second penetrating holes 11j2 are formed so as to overlap part of the four first penetrating holes 11d2 that are projected onto the ground wiring portion 11f1 of the second conductive layer 11f in a parallel manner. More specifically, two of the four second penetrating holes 11j2 have substantially the same width and length, and the remaining two have the same width as the other two while having a different length. The four second penetrating holes 11j2 are formed in positions that partially overlap in the lengthwise direction with the four first penetrating holes 11d2 that are projected in a parallel manner, respectively. These four second penetrating holes 11j2 are not filled with a synthetic resin. The width of each second penetrating hole 11j2 is set to 0.01 to 1.0 mm, for example, and more preferably to 0.05 to 0.2 mm. The length thereof is set to 0.01 to 5.0 mm, for example, and more preferably to 0.1 to 1.0 mm.

In the ground wiring portion 11f1 of the second conductive layer 11f, two penetrating holes 11f3 in a substantially circular shape are formed so as to correspond to the input terminal 12c and the output terminal 12d of the SAW filter 12, and inside of the respective two penetrating holes 11f3, conductor vias 11f4 are formed so as not to make contact with the penetrating holes 11f3. The conductor vias 11f4 have a T-shaped cross section, and are constituted of a disk portion and a columnar portion, respectively. The thickness and the height of the disk portions of the two conductor vias 11f4 are the same as those of the ground wiring portion 11f1, and the bottom ends of the two conductor vias 11f4 are connected to the upper surfaces of the respective disk portions of the two conductor vias 11d4 formed in the ground wiring portion 11d1 of the first conductive layer 11d. Respective ring-shaped spaces between the two penetrating holes 11f3 and the respective disk portions of the two conductor vias 11f4, which are disposed therein, are not filled with a synthetic resin.

Figure 6:
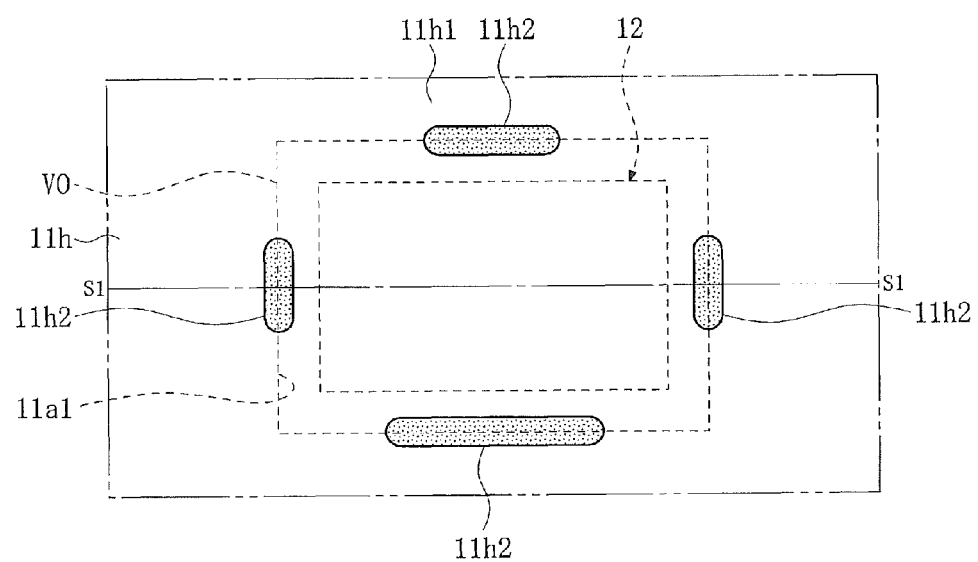
FIG. 6 is a horizontal cross-sectional view along the line S6-S6 of FIG. 1.

As shown in FIG. 6, in the ground wiring portion 11h1 of the third conductive layer 11h that is closest to the lower surface of the core layer 11a, four first penetrating holes 11h2 are formed so as to overlap part of the opening edge V0 of the storage portion 11a1 that is projected onto the ground wiring portion 11h1 of the third conductive layer 11h in a parallel manner. More specifically, two of the four first penetrating holes 11h2 have substantially the same width and length, and the remaining two have substantially the same width as the other two while having a different length. The four first penetrating holes 11h2 are formed such that the respective centers thereof in the width direction substantially coincide with respective four sides of the opening edge V0 of the storage portion 11a1 projected in a parallel manner. The four first penetrating holes 11h2 are respectively filled with the same synthetic resin as that forming the fourth insulating layer 11i, for example. The width of each first penetrating hole 11h2 is set to 0.01 to 1.0 mm, for example, and more preferably to 0.05 to 0.2 mm. The length thereof is set to 0.01 to 5.0 mm, for example, and more preferably to 0.1 to 1.0 mm.

Figure 7:
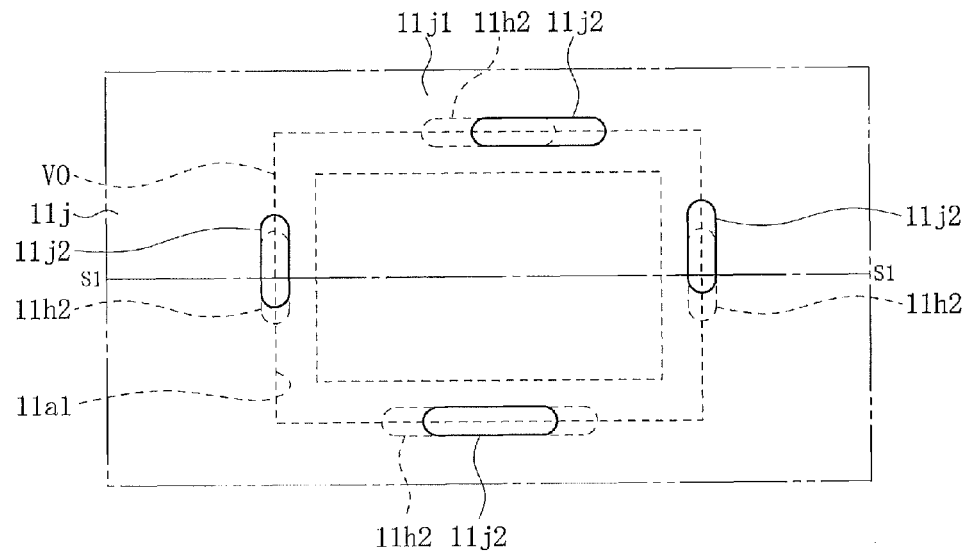
FIG. 7 is a horizontal cross-sectional view along the line S7-S7 of FIG. 1.

As shown in FIG. 7, in the ground wiring portion 11j1 of the fourth conductive layer 11j that is second closest to the lower surface of the core layer 11a, four second penetrating holes 11j2 are formed so as to overlap part or all of the four first penetrating holes 11h2 that are projected onto the ground wiring portion 11j1 of the fourth conductive layer 11j in a parallel manner. More specifically, two of the four second penetrating holes 11j2 have substantially the same width and length, and the remaining two have substantially the same width as the other two while having a different length. Three of the four second penetrating holes 11j2 are formed so as to partially overlap in the lengthwise direction with three of the four first penetrating holes 11h2 that are projected in a parallel manner, and one of the four second penetrating holes 11j2 is formed such that the center thereof in the lengthwise direction coincides with the center in the lengthwise direction of one of the four first penetrating holes 11h2 that are projected in a parallel manner. These four second penetrating holes 11j2 are not filled with a synthetic resin. The width of each second penetrating hole 11j2 is set to 0.01 to 1.0 mm, for example, and more preferably to 0.05 to 0.2 mm. The length thereof is set to 0.01 to 5.0 mm, for example, and more preferably to 0.1 to 1.0 mm.

Below, effects of the substrate with built-in electronic component shown in FIGS. 1 to 7 will be explained.

Generally, various electronic components are mounted on the substrate with built-in electronic component by the reflow soldering method. Among the synthetic resin filler 11b and the respective insulating layers 11c, 11e, 11g, and 11i made of a synthetic resin, the synthetic resin filler 11b that have a larger mass includes more moisture than the respective insulating layers 11c, 11e, 11g, and 11i, and therefore, due to the heat generated by the reflow soldering, moisture included in the synthetic resin filler 11b is evaporated, and vapor tries to escape to the outside. More specifically, vapor generated in the synthetic resin filler 11b moves toward the top and bottom sides along the inner walls of the storage portion 11a1.

(Effect 1) In the substrate with built-in electronic component described above, four first penetrating holes 11d2 are formed in the ground wiring portion 11d1 of the first conductive layer 11d that is closest to the upper surface of the core layer 11a so as to overlap part of the opening edge V0 of the storage portion 11a1 that is projected onto the ground wiring portion 11d1 of the first conductive layer 11d in a parallel manner. Therefore, most of the vapor that moves toward the upper side along the inner walls of the storage portion 11a1 can be guided smoothly to the second insulating layer 11e through the first insulating layer 11c and the four first penetrating holes 11d2. Similarly, in the ground wiring portion 11h1 of the third conductive layer 11h that is closest to the lower surface of the core layer 11a, four first penetrating holes 11h2 are formed so as to overlap part of the opening edge V0 of the storage portion 11a1 that is projected onto the ground wiring portion 11h1 of the third conductive layer 11h in a parallel manner. Therefore, most of the vapor that moves toward the lower side along the inner walls of the storage portion 11a1 can be guided smoothly to the fourth insulating layer 11i through the third insulating layer 11g and the four first penetrating holes 11h2.

That is, as compared with the case in which the vapor generated in the synthetic resin filler 11b is guided to the first insulating layer 11c and the third insulating layer 11g that are respectively closest to the core layer 11a, the vapor pressure applied to the first insulating layer 11c and the third insulating layer 11g can be reduced. Therefore, it is possible to prevent the problems of a crack formed in the first insulating layer 11c and the third insulating layer 11g resulting from the vapor pressure, the layer separation between the first insulating layer 11c and the core layer 11a, the layer separation between the third insulating layer 11g and the core layer 11a, the layer separation between the first insulating layer 11c and the first conductive layer 11d, the layer separation between the third insulating layer 11g and the third conductive layer 11h, and the like.

(Effect 2) In the substrate with built-in electronic component described above, four second penetrating holes 11f2 are formed in the ground wiring portion 11f1 of the second conductive layer 11f that is second closest to the upper surface of the core layer 11a so as to respectively overlap part of the first penetrating holes 11d2 that are projected onto the ground wiring portion 11f1 of the second conductive layer 11f in a parallel manner. Therefore, it is possible to release most of the vapor that moves toward the upper side along the inner walls of the storage portion 11a1 to the outside through the first insulating layer 11c, the four first penetrating holes 11d2 (filled with a synthetic resin; see FIG. 3), the second insulating layer 11e, and the four second penetrating holes 11f2 (not filled with a synthetic resin; see FIG. 4) (see the release route PW shown in the top side of FIG. 1). Similarly, four second penetrating holes 11j2 are formed in the ground wiring portion 11j1 of the fourth conductive layer 11j that is second closest to the lower surface of the core layer 11a so as to respectively overlap part or all of the first penetrating holes 11h2 that are projected onto the ground wiring portion 11j1 of the fourth conductive layer 11j in a parallel manner. Therefore, it is possible to release most of the vapor that moves toward the lower side along the inner walls of the storage portion 11a1 to the outside through the third insulating layer 11g, the four first penetrating holes 11h2 (filled with a synthetic resin; see FIG. 6), the fourth insulating layer 11i, and the four second penetrating holes 11j2 (not filled with a synthetic resin; see FIG. 7) (see the release route PW shown in the bottom side of FIG. 1).

That is, as compared with the case in which the vapor that passed through the four first penetrating holes 11d2 and the four first penetrating holes 11h2 is guided to the second insulating layer 11e and the fourth insulating layer 11i, the vapor pressure applied to the second insulating layer 11e and the fourth insulating layer 11i can be reduced. Therefore, it is possible to prevent the problems of a crack formed in the second insulating layer 11e and the fourth insulating layer 11i resulting from the vapor pressure, the layer separation between the second insulating layer 11e and the second conductive layer 11f, the layer separation between the fourth insulating layer 11i and the fourth conductive layer 11j, and the like.

(Effect 3) In the substrate with built-in electronic component described above, the shapes of some of the four second penetrating holes 11f2 formed in the ground wiring portion 11f1 of the second conductive layer 11f that is second closest to the upper surface of the core layer 11a differ from the shape of the four first penetrating holes 11d2 that are projected onto the ground wiring portion 11f1 of the second conductive layer 11f in a parallel manner. Therefore, it is possible to control the pressure and direction of the vapor that passed through the four first penetrating holes 11d2 by the shape difference. Similarly, the shapes of some of the four second penetrating holes 11j2 formed in the ground wiring portion 11j1 of the fourth conductive layer 11j that is second closest to the lower surface of the core layer 11a differ from the shape of the four first penetrating holes 11f2 that are projected onto the ground wiring portion 11j1 of the fourth conductive layer 11j in a parallel manner. Therefore, it is possible to control the pressure and direction of the vapor that passed through the four first penetrating holes 11f2 by the shape difference.

That is, the pressure and direction of the vapor that passed through the four first penetrating holes 11d2 and the four first penetrating holes 11h2 can be controlled by the shapes of the four second penetrating holes 11f2 and the four second penetrating holes 11j2, which makes it possible to change the flow volume of the vapor that is released to the outside from the four second penetrating holes 11f2 and the four second penetrating holes 11j2 by taking into consideration the positions of the various electronic components mounted on the substrate with built-in electronic component.

(Effect 4) In the substrate with built-in electronic component described above, the SAW filter 12 has the input terminal 12c and the output terminal 12d that face the ground wiring portion 11f1 of the first conductive layer 11f that is closest to the upper surface of the core layer 11a and the ground terminals 12e connected to the ground wiring portion 11f1 of the first conductive layer 11f, and the first penetrating holes 11d2 are not present in a region that connects the input terminal 12c to the output terminal 12d that are projected onto the ground wiring portion 11f1 of the first conductive layer 11f in a parallel manner (see FIGS. 2 and 3). Therefore, even when a return current of the current that flows through the input terminal 12c and the output terminal 12d of the SAW filter 12 flows through the ground wiring portion 11f1 of the first conductive layer 11f, the length of the path of the return current can be minimized, which prevents problems caused by the return current path being longer such as impedance mismatch, and as a result, the desired properties of the SAW filter 12 can be maintained.

Embodiment 2

Figure 8:
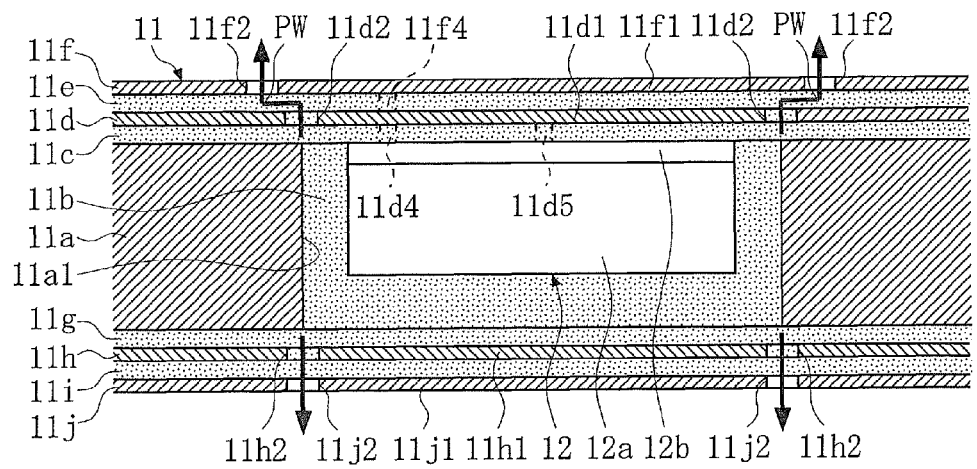
FIG. 8 is a vertical cross-sectional view showing a main part of a substrate with built-in electronic component according to Embodiment 2 of the present invention.
Figure 9:
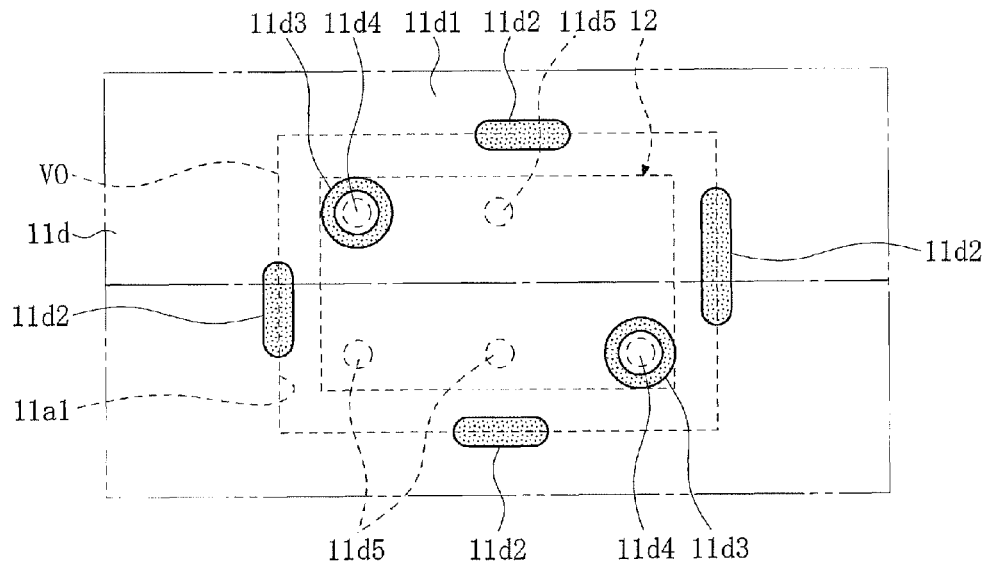
FIG. 9 is a horizontal cross-sectional view of FIG. 8 corresponding to FIG. 3.
Figure 10:
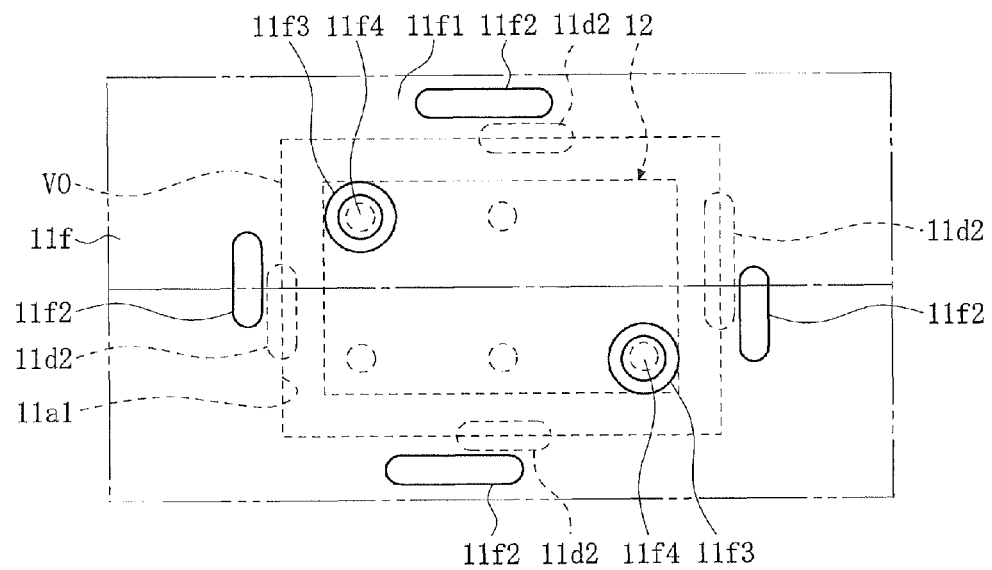
FIG. 10 is a horizontal cross-sectional view of FIG. 8 corresponding to FIG. 4.

A substrate with built-in electronic component shown in FIGS. 8 to 10 has a multilayer substrate 11 and an electronic component built therein, which is a SAW filter 12, in a manner similar to the substrate with built-in electronic component described in Embodiment 1 above. The substrate with built-in electronic component differs from the substrate with built-in electronic component described in Embodiment 1 in the structure of the second conductive layer 11f. Because other structures are the same as those of the substrate with built-in electronic component described in Embodiment 1, the descriptions thereof are omitted.

That is, as shown in FIG. 10, in the ground wiring portion 11f1 of the second conductive layer 11f that is second closest to the upper surface of the core layer 11a, four second penetrating holes 11f2 are formed so as to be close to but not to overlap the four first penetrating holes 11d2 that are projected onto the ground wiring portion 11f1 of the second conductive layer 11f in a parallel manner. More specifically, the four second penetrating holes 11f2 have substantially the same width and length as the first penetrating holes 11d2, and are formed so as to be outside of the first penetrating holes 11d2 that are projected in a parallel manner. These four second penetrating holes 11f2 are not filled with a synthetic resin. The width of each second penetrating hole 11f2 is set to 0.01 to 1.0 mm, for example, and more preferably to 0.05 to 0.2 mm. The length thereof is set to 0.01 to 5.0 mm, for example, and more preferably to 0.1 to 1.0 mm. Each second penetrating hole 11f2 is formed so as to be close to each first penetrating hole 11d2 at a distance of 0.01 to 1.0 mm, but not to overlap therewith.

With the substrate with built-in electronic component shown in FIGS. 8 to 10, the release route PW shown in the top side of FIG. 8 becomes slightly longer than the release route PW shown in the top side of FIG. 1, but effects similar to Effects 1 to 4 above can be obtained. Also, in the substrate with built-in electronic component shown in FIGS. 8 to 10, each second penetrating hole 11f2 is formed so as to be close to but not overlap each first penetrating hole 11d2, and therefore, another advantage of improving the shield effect to suppress the outside noise can be achieved.

Other Embodiments (1) In Embodiments 1 and 2 above, the core layer 11a was made of a metal such that the synthetic resin filler 11b has a higher moisture absorbency than the core layer 11a, but it is also possible to form the core layer 11a of other materials than a metal that have a lower moisture absorbency than that of the synthetic resin filler 11b such as ceramics or a synthetic resin. In this case, effects similar to Effects 1 to 4 above can be achieved.

In the case of forming the core layer 11a of a synthetic resin, when the core layer 11a is made of a different type of synthetic resin from that forming the synthetic resin filler 11b and the respective insulating layers 11c, 11e, 11g, and 11i, a synthetic resin that has a lower moisture absorbency than that of the synthetic resin filler 11b can be used. In the case of forming the core layer 11a of the same kind of synthetic resin as the synthetic resin filler 11b and the respective insulating layers 11c, 11e, 11g, and 11i, or in the case of forming the core layer 11a of a different kind of synthetic resin that has substantially the same moisture absorbency as the synthetic resin filler 11b and the respective insulating layers 11c, 11e, 11g and 11i, the moisture absorbency of the synthetic resin that forms the core layer can be made lower than that of the synthetic resin filler 11b by adding a reinforcing material such as glass fiber only to the synthetic resin. Alternatively, the moisture absorbency of the synthetic resin that forms the core layer can be made lower than that of the synthetic resin filler 11b by adding more reinforcing material to the synthetic resin than in the synthetic resin filler 11b.

(2) In Embodiments 1 and 2 above, the second penetrating holes 11f2 and 11j2 were not filled with a synthetic resin. However, in a manner similar to the first penetrating holes 11d2 and 11h2, the second penetrating holes 11f2 and 11j2 may be filled with a synthetic resin. In this case, effects similar to Effects 1 to 4 above can be achieved.

(3) In Embodiments 1 and 2 above, four first penetrating holes 11d2 were formed in the first conductive layer 11d, and four first penetrating holes 11h2 were formed in the third conductive layer 11h. However, the number of the first penetrating holes 11d2 and 11h2 may be one to three, or five or more. Also, the shape of the holes is not limited to that shown in the figures, and may be formed in various shapes such as a circular shape or a polygonal shape. The positions of the respective holes can also be appropriately changed. That is, as long as at least one first penetrating hole is provided so as to overlap at least a part of the opening edge V0 of the storage portion 11a1 that is projected onto at least one of the first conductive layer 11d and the third conductive layer 11h, an effect similar to Effect 1 above can be achieved.

(4) In Embodiments 1 and 2, four second penetrating holes 11f2 were formed in the second conductive layer 11f, and four second penetrating holes 11j2 were formed in the fourth conductive layer 11j. However, the number of the second penetrating holes 11f2 and 11j2 may be one to three, or five or more. Also, the shape of the holes is not limited to that shown in the figures, and may be formed in various shapes such as a circular shape or a polygonal shape. The positions of the respective holes can also be appropriately changed. That is, as long as at least one second penetrating hole is provided so as to overlap at least a part of the first penetrating hole 11d2 or the first penetrating hole 11h2 that is projected onto at least one of the second conductive layer 11f and the fourth conductive layer 11j, or as long as at least one second penetrating hole is provided so as to be close to but not to overlap the first penetrating hole 11d2 or the first penetrating hole 11h2 that is projected onto at least one of the second conductive layer 11f and the fourth conductive layer 11j, effects similar to Effects 2 and 3 above can be achieved.

(5) In Embodiments 1 and 2 above, two pairs of insulating layers and conductive layers were provided on each of the upper and lower surfaces of the core layer 11a, but even when there are three or more pairs of insulating layers and conductive layers, as long as the conditions of (3) or (4) above are satisfied, effects similar to Effect 1 or Effects 2 and 3 above can be achieved.

(6) In Embodiments 1 and 2 above, the SAW filter 12 was stored in the storage portion 11a1 of the core layer 11a, but instead of the SAW filter 12, other types of elastic wave filters such as a BAW filter utilizing bulk acoustic waves may be stored therein, or other electronic components such as an IC chip having an input terminal, an output terminal, and ground terminals in a manner similar to the SAW filter 12 may be stored therein. That is, as long as an electronic component has an input terminal and an output terminal facing the conductive layer 11d and ground terminals connected to the conductive layer 11d, and the first penetrating holes are not present in a region that connects the input terminal and the output terminal of the electronic component that are projected onto the conductive layer 11d in a parallel manner, an effect similar to Effect 4 above can be achieved. It is apparent that even when other electronic components that do not meet the above-mentioned conditions such as a capacitor, inductor, or resistor are embedded, effects similar to Effects 1 to 3 above can be achieved.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A substrate with built-in electronic component, comprising;
    a core layer having a storage portion penetrating the core layer;
    an electronic component stored in the storage portion;
    a synthetic resin filler filling a space between the electronic component and inner walls of the storage portion, the synthetic resin filler having a higher moisture absorbency than that of the core layer; and
    two or more pairs of an insulating layer and a conductive layer disposed on two opposite surfaces of the core layer in a thickness direction, the insulating layers being made of a synthetic resin, the conductive layers being made of a metal,
    wherein, of the two or more pairs of the insulating layer and the conductive layer disposed on at least one of two opposite surfaces of the core layer in a thickness direction, a conductive layer closest to the core layer has at least one first penetrating hole formed therein so as to overlap at least part of an opening edge of the storage portion in a plan view;
    wherein, of the two or more pairs of the insulating layer and the conductive layer, a conductive layer other than the conductive layer closest to the core layer has at least one second penetrating hole formed therein so as to overlap at least part of the first penetrating hole in a plan view.

2. The substrate with built-in electronic component according to claim 1, wherein a shape of the second penetrating hole differs from a shape of the first penetrating hole in a plan view.

3. The substrate with built-in electronic component according to claim 1, wherein the storage portion is formed in a substantially rectangular cuboid shape, and the electronic component is formed in a substantially rectangular cuboid shape that is smaller than the storage portion.

4. The substrate with built-in electronic component according to claim 1, wherein the electronic component has input and output terminals facing a conductive layer closest to the core layer and a ground terminal connected to said conductive layer, and wherein the first penetrating hole is not present in a region between the input terminal and the output terminal of the electronic component in a plan view.

5. The substrate with built-in electronic component according to claim 1, wherein the electronic component is one of an elastic wave filter, an IC chip, a capacitor, an inductor, and a resistor.

6. The substrate with built-in electronic component according to claim 1, wherein the core layer is made of a metal.

7. The substrate with built-in electronic component according to claim 1, wherein the core layer and a synthetic resin filler that has a higher moisture absorbency than the core layer are made of a synthetic resin that contains a reinforcing material, and a synthetic resin that forms the core layer has a higher content of the reinforcing material than the synthetic resin filler having a higher moisture absorbency than the core layer.

8. The substrate with built-in electronic component according to claim 1, wherein said at least one first penetrating hole is filled with a synthetic resin that allows vapor from the synthetic resin filler to go through.

9. The substrate with built-in electronic component according to claim 1, wherein said conductive layer closest to the core layer is a ground pattern that covers a substantial entirety of the electronic component in the storage portion in a plan view except areas for terminal connections and said at least one first penetrating hole.

10. A substrate with built-in electronic component, comprising:
    a core layer having a storage portion penetrating the core layer;
    an electronic component stored in the storage portion;
    a synthetic resin filler filling a space between the electronic component and inner walls of the storage portion, the synthetic resin filler having a higher moisture absorbency than that of the core layer; and
    two or more pairs of an insulating layer and a conductive layer disposed on two opposite surfaces of the core layer in a thickness direction, the insulating layers being made of a synthetic resin, the conductive layers being made of a metal,
    wherein, of the two or more pairs of the insulating layer and the conductive layer disposed on at least one of two opposite surfaces of the core layer in a thickness direction, a conductive layer closest to the core layer has at least one first penetrating hole configured such that vapor from the synthetic resin filler goes through;
    wherein, of the two or more pairs of the insulating layer and the conductive layer, a conductive layer other than the conductive layer closest to the core layer has at least one second penetrating hole formed therein so as to overlap at least part of the first penetrating hole in a plan view.

* * * * *